United States Patent
Chien et al.

(10) Patent No.: US 9,166,149 B2
(45) Date of Patent: Oct. 20, 2015

(54) MAGNETIC DEVICE WITH A SUBSTRATE, A SENSING BLOCK AND A REPAIR LAYER

(71) Applicant: INDUSTRIAL TECHNOLOGY RESEARCH INSTITUTE, Hsinchu (TW)

(72) Inventors: Cheng Wei Chien, Taoyuan County (TW); Kuei Hung Shen, Hsinchu (TW); Yung Hung Wang, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/530,044

(22) Filed: Oct. 31, 2014

(65) Prior Publication Data

US 2015/0076634 A1    Mar. 19, 2015

Related U.S. Application Data

(63) Continuation-in-part of application No. 13/686,663, filed on Nov. 27, 2012, now Pat. No. 8,901,687.

(51) Int. Cl.
    *H01L 29/82* (2006.01)
    *H01L 43/10* (2006.01)
    *H01L 43/02* (2006.01)
    *H01L 43/08* (2006.01)
    *G11C 11/16* (2006.01)

(52) U.S. Cl.
    CPC .............. *H01L 43/10* (2013.01); *G11C 11/161* (2013.01); *H01L 43/02* (2013.01); *H01L 43/08* (2013.01)

(58) Field of Classification Search
    CPC ..... H01L 43/08; H01L 29/82; H01L 23/5226; H01L 23/528; H01L 27/222; H01L 43/065; G11C 11/16
    USPC ...... 257/421–427, E29.323; 438/3; 365/157–158, 171–173; 360/324–326
    See application file for complete search history.

(56) References Cited

U.S. PATENT DOCUMENTS

| | | | |
|---|---|---|---|
| 7,999,338 B2 * | 8/2011 | Zheng et al. | 257/421 |
| 2011/0102948 A1 * | 5/2011 | Apalkov et al. | 360/324.2 |
| 2014/0056051 A1 * | 2/2014 | Wu et al. | 365/104 |

* cited by examiner

*Primary Examiner* — Jami M Valentine
(74) *Attorney, Agent, or Firm* — WPAT, P.C.; Anthony King

(57) ABSTRACT

A magnetic device includes a substrate, a sensing block and a repair layer. The substrate has a bottom electrode, a registration layer and a barrier layer disposed on the registration layer. The sensing block is patterned to distribute on the barrier layer. The repair layer is disposed substantially on the barrier layer, wherein the barrier layer is configured to have a tunneling effect when a bias voltage exists between the sensing block and the registration layer.

14 Claims, 7 Drawing Sheets

MAGNETIC DEVICE WITH A SUBSTRATE, A SENSING BLOCK AND A REPAIR LAYER

PRIORITY CLAIM AND CROSS-REFERENCE

This application is a Continuation-in-Part (CIP) application of U.S. application Ser. No. 13/686,663 filed on Nov. 27, 2012, entitled "Magnetic Device with a Substrate, a Sensing Block and a Repair Layer", the disclosure of which is hereby incorporated by reference in its entirety.

FIELD OF THE INVENTION

The present disclosure generally relates to a magnetic device, and particularly to a memory storage device that uses a magnetic moment to store data.

BACKGROUND

Ferromagnetic material is utilized to manufacture a non-volatile memory device, such as magnetoresistive RAM (MRAM). Since its discovery in 1970, the tunneling effect of the magnetic tunnel junction (MTJ) has caused a dramatic change in the use of magnetic memory devices. The MTJ usually consists of at least three layers, which are the pinned layer, the barrier layer and the free layer. As a result, the stored memory in the domain can be written or read by sensing the current tunneling through the barrier.

The correctivity or the ratio of the self spin-polarization is one of the major concerns regarding the efficiency and accuracy of when to read or write the memory storage domain. One possible reason for the degraded performance is attributed to the damage on the film during manufacturing. Etching or plasma bombardments attacking the exposure surface during the process or oxidation of the post-etched film surface are probable factors. It was reported that even introducing a cap layer, such as silicon nitride, on the device right after the etching process would cause degradation. Therefore, in order to improve the performance of a magnetic memory device, the process of repairing the damage or reducing the oxidation of the device is essential.

SUMMARY OF THE INVENTION

The objective of the present disclosure is to provide a magnetic device including a substrate, a sensing block and a repair layer. The substrate has a bottom electrode, a registration layer and a barrier layer disposed on the registration layer. The sensing block is patterned to distribute on the barrier layer. The repair layer is disposed on the barrier layer and the registration layer is configured to store data.

The objective of another embodiment of the present disclosure is to provide a racetrack magnetic memory device including a substrate, a sensing block and a repair layer. The substrate has a bottom electrode, a registration layer and a barrier layer disposed on the registration layer. The sensing block is patterned to distribute on the barrier layer. The repair layer is disposed on the barrier layer and the registration layer is configured to store data.

BRIEF DESCRIPTION OF THE DRAWINGS

The invention will be described according to the appended drawings in which:

FIG. 3 illustrates provision of a substrate, a registration layer, a barrier layer according to the present disclosure;

FIG. 4 illustrates arrangement of a mask over a sensing block according to the present disclosure;

FIG. 5 illustrates patterning of a sensing block according to the present disclosure;

FIG. 6 illustrates deposition of a repair layer over a sensing block and a barrier layer according to the present disclosure;

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references. The term "coupled" implies that the elements may be directly connected together or may be coupled through one or more intervening elements.

Figure 1:
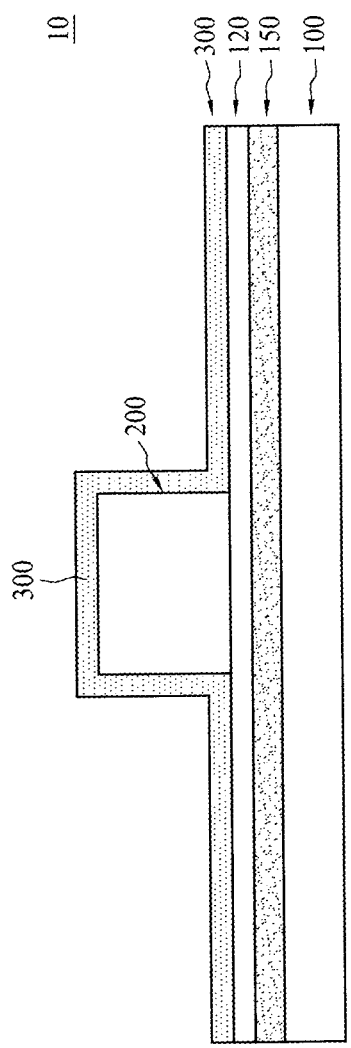
FIG. 1 illustrates a magnetic device according to the present disclosure.

The first embodiment according to the present disclosure can be referred to FIG. 1. A magnetic device 10 has a substrate 100, a sensing block 200 and a repair layer 300. In some embodiments, the magnetic device 10 includes a bottom electrode. In some embodiments, the bottom electrode is disposed above substrate 100. The sensing block 200 is disposed above the barrier layer 120. In another embodiment, there are a plurality of sensing blocks 200 disposed on the substrate 100. The sensing block 200 can be a multi-layered film stack and the sequence of the stacking films is not limited as the illustrated embodiments.

Figure 2:
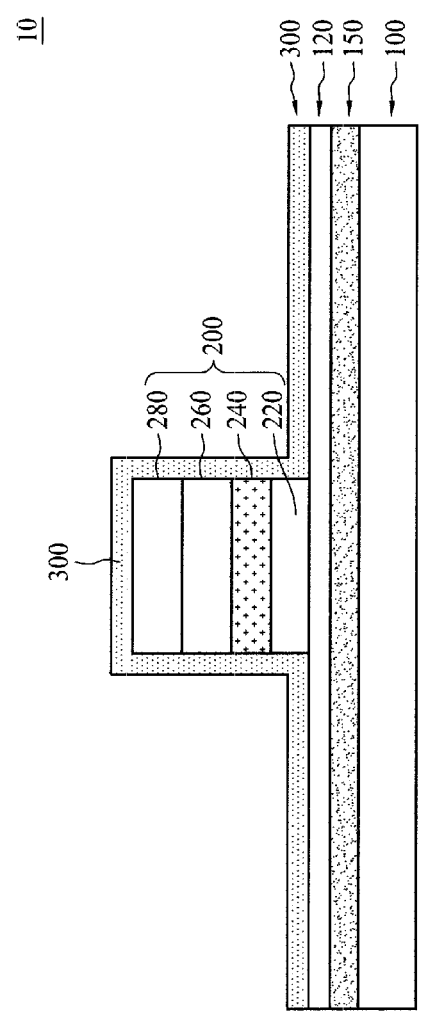
FIG. 2 illustrates other magnetic devices according to the present disclosure.

As shown in FIG. 2, the multi-layered stack sensing block 200 includes at least four different thin film layers; there are a first ferromagnetic layer 220 on a barrier layer 120, a non-magnetic layer 240 disposed on the first ferromagnetic layer 220, a second ferromagnetic layer 260 on the non-magnetic layer 240, and an anti-ferromagnetic layer 280 on the second ferromagnetic layer 260. A fixed layer is shown collectively as layers 220-280 in FIG. 2 which comprises a synthetic anti-ferromagnetic (SAF) structure. The non-magnetic metal layer 240 can be a metal layer and made with material such as Ru, Rh, Cu, etc. The first ferromagnetic layer 220 and the second ferromagnetic layer 260 is made of any ferromagnetic material with in-plane magnetic anisotropy (IMA) such as CoFe, CoFeB or bilayer of CoFe/CoFeB or CoFeB/Fe. The anti-ferromagnetic layer 280 can be made with material such as PtMn, IrMn, NiMn, etc. Moreover, a registration layer 150 is disposed on the substrate 100. The barrier layer 120 is sandwiched between the registration layer 150 and the sensing block 200. In some embodiments, the bottom electrode is disposed between the substrate 100 and the registration layer 150. In an embodiment, the barrier layer 120 is between the registration layer 150 and the first ferromagnetic layer 220. The registration layer 150 is made with ferromagnetic materials with IMA such as permalloy, Fe, Co, nickel (Ni), CoFe, CoFeB or any kind of magnetic alloy. The registration layer 150 can be optionally used to store memory according to the injected electric current from a write line (not shown) which electrically connected to the registration layer 150. The barrier layer 120 is made with electric insulating material, such as AlOx, MgxOy, etc. The thickness of the barrier layer 120 is around 10 A so as to have electrons tunneling through the barrier layer 120 if a bias voltage is applied between the registration layer 150 and the sensing block 200. The repair layer 300 is disposed on the barrier layer 120.

Figure 3:
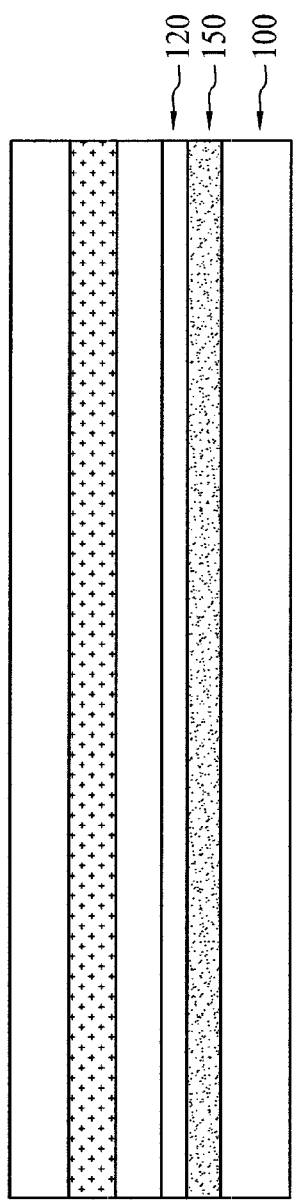
FIGS. 3-6 depict the process to manufacture an embodiment according to the present disclosure.
Figure 4:
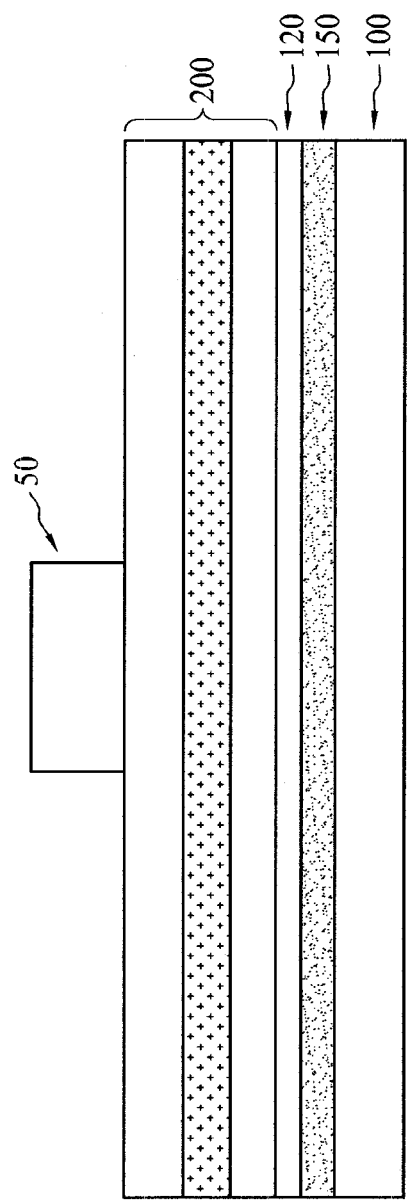

The process of manufacturing the magnetic device 10 can be accomplished in various ways in accordance to each user's preference. In one embodiment according to the present disclosure, thin film deposition such as PVD, CVD, etc. is utilized to form the registration layer 150, the barrier layer 120 and the films constructing the sensing block stack 200 in different steps. As shown in FIG. 3, the aforementioned films are blanket deposited sequentially on the substrate 100. A mask step (mask 50) is arranged on the top of the film stack as shown in FIG. 4. The mask step is followed by an etching step, preferred as a dry etch in the present embodiment.

Figure 5:
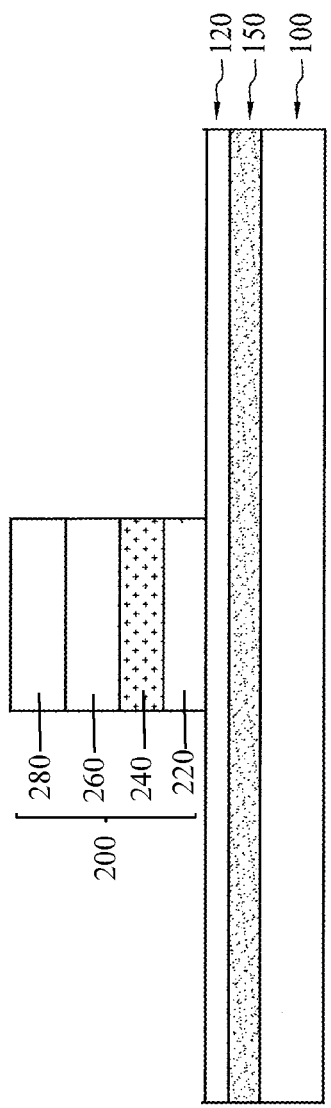
Figure 5A:
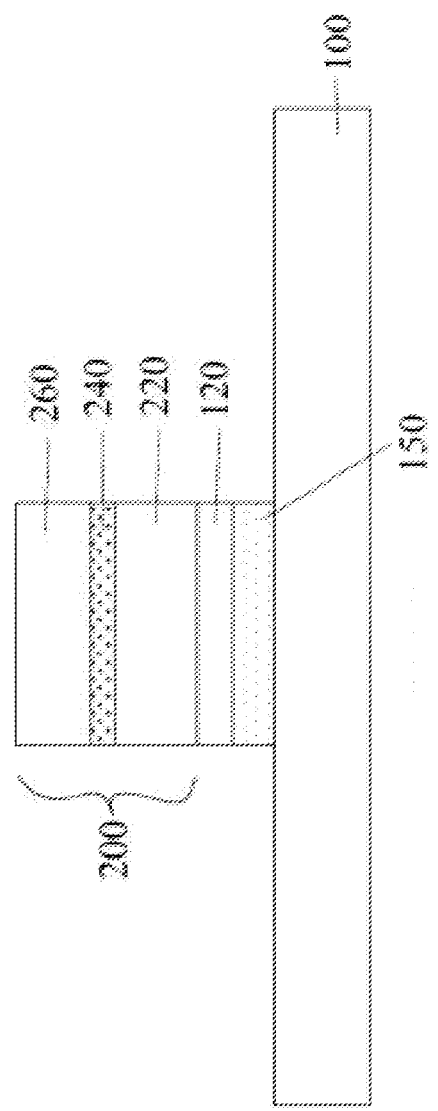
FIG. 5A illustrates etching of some portions of a registration layer and/or a barrier layer according to the present disclosure.
Figure 6:
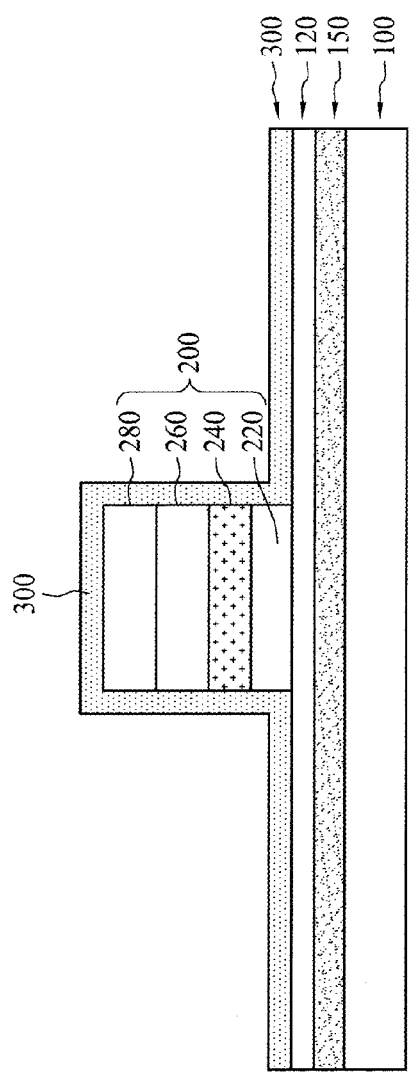
Figure 6A:
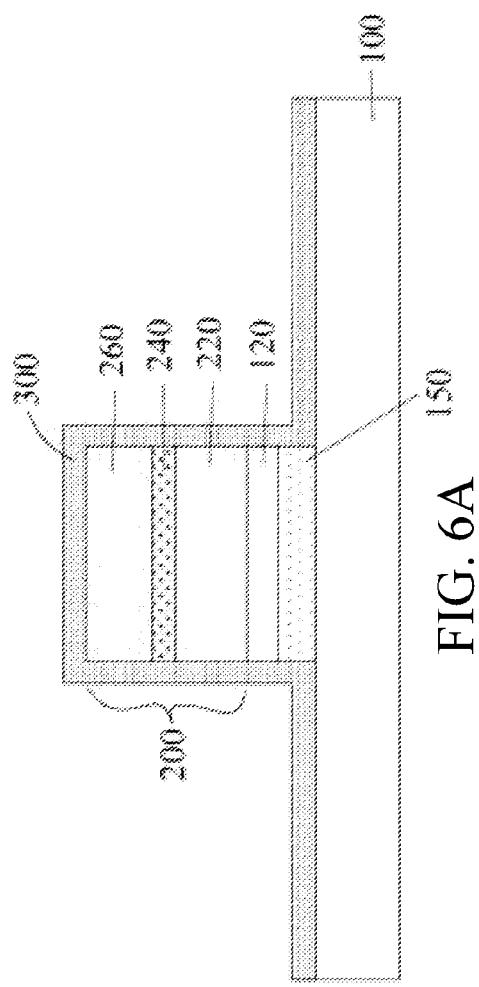
FIG. 6A illustrates deposition of a repair layer over a sensing block and a substrate according to the present disclosure.

In some embodiments, a portion of the sensing block 200 is carved out and finally a desired pattern forms as shown in FIG. 5. In some embodiments as in FIG. 5A, some portions of the registration layer 150 and/or the barrier layer 120 without coverage of the mask 50 are also etched. The sensing block 200 can act as a terminal to read out the data if there is any current tunneling from the registration layer 150 into the sensing block 200, reversely, the registration layer 150 also can act as a terminal to read out the data if there is any current tunneling from the sensing block 200 into the registration layer 150. The repair layer 300 can form subsequently after the etching step is accomplished. In some embodiments, the repair layer 300 is preferably disposed on the barrier layer 120 with a thin film deposition process as shown in FIG. 6. In some embodiments as in FIG. 6A, the repair layer 300 is disposed conformal to the substrate 100, the registration layer 150, the barrier layer 120 and the sensing block 200.

The material which is selected to form the repair layer 300 may possess a standard oxidation potential value, $E_r$, which is greater than the standard oxidation potential value of the registration layer 150, $E_b$. In an exemplary embodiment, the oxidation potential value, $E_r$ of the repair layer is greater than 0.44V.

In another example, the material for the repair layer 300 can be metal and is preferably selected from Mg, Al, Ti, Mn, Zn, Cr, Ta, or the combination thereof, resulting in the oxygen concentration in the barrier layer 120 to be lowered after coming in contact with the repair layer 300.

In another embodiment, the alloy of Mg, Al, Ti, Mn, Zn, Cr, or Ta is used to form the repair layer 300. Moreover, metal oxide is also an option to form the repair layer 300. In one embodiment, all possible oxidation states of the following metals: Mg, Al, Ti, Mn, Zn, Cr, Ta, or the combination thereof can be chosen to achieve the same objective of the present disclosure.

Figure 7:
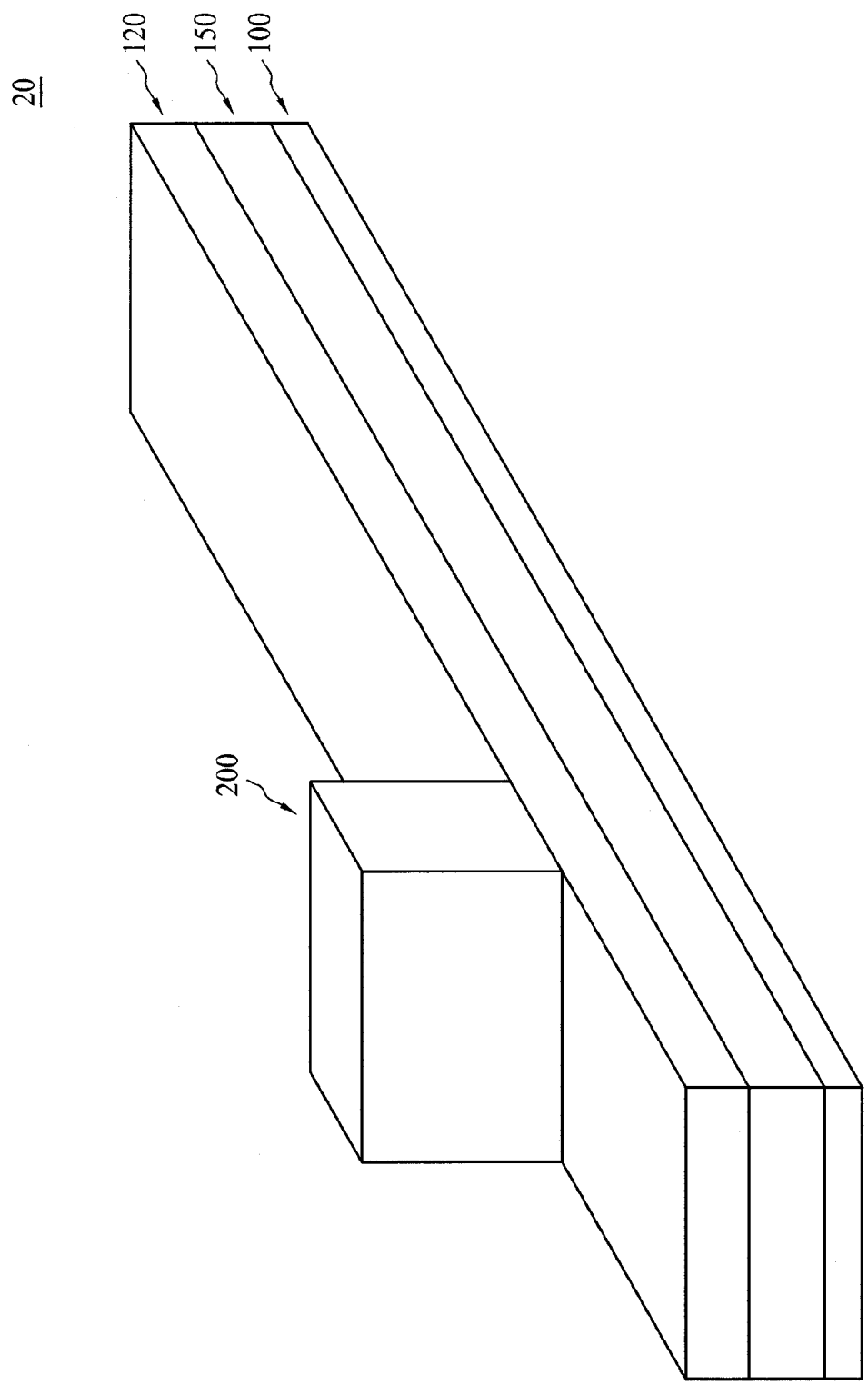
FIG. 7 illustrates a racetrack magnetic memory device according to the present disclosure.

FIG. 7 depicts another embodiment according to the present disclosure. A racetrack magnetic memory device 20 has a substrate 100, a registration layer 150 disposed on the substrate 100, and a barrier layer 120 disposed on the registration layer 150. In some embodiments, the racetrack magnetic memory device 20 includes a bottom electrode. In some embodiments, the bottom electrode is disposed above substrate 100. In some embodiments, the bottom electrode is disposed between the substrate 100 and the registration layer 150. A sensing block 200 is disposed on the barrier layer 120. In another embodiment, there is a plurality of sensing blocks 200 disposed on the barrier layer 120. The sensing block 200 can be a multi-layered film stack. The registration layer 150 and the barrier layer 120 are etched to be like a racetrack.

Figure 8:
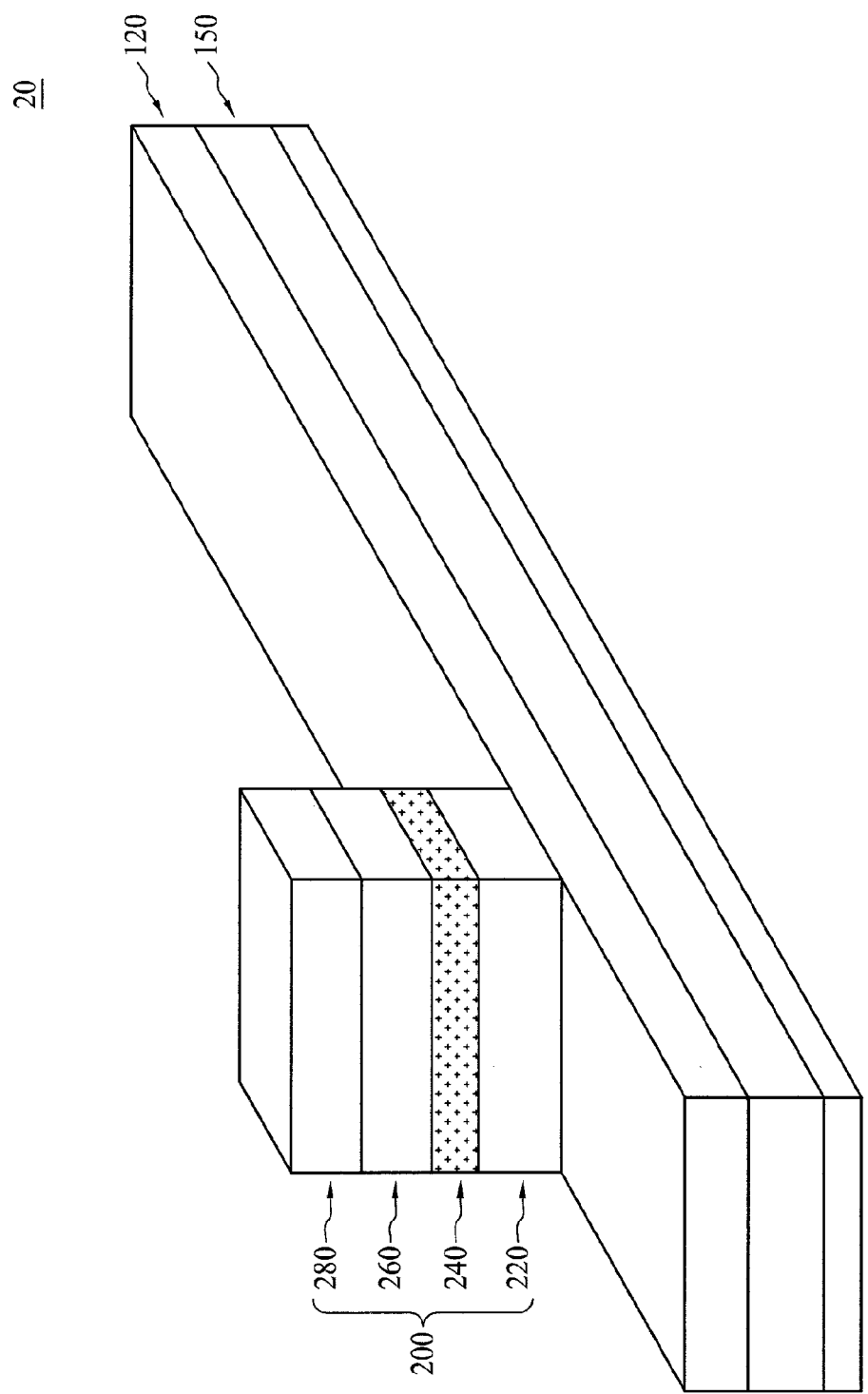
FIG. 8 illustrates racetrack magnetic memory devices having a multi-layered stack sensing block.

FIG. 8 illustrated another racetrack magnetic memory device according to the present disclosure. There are four different thin film layers, a first ferromagnetic layer 220 on a barrier layer 120, a non-magnetic layer 240 disposed on the first ferromagnetic layer 220, a second ferromagnetic layer 260 on the non-magnetic layer 240, and an anti-ferromagnetic layer 280 on the second ferromagnetic layer 260. A fixed layer is shown collectively as layers 220-280 in FIG. 8 which comprises a synthetic anti-ferromagnetic (SAF) structure. The non-magnetic metal layer 240 can be a metal layer and made with material such as Ru, Rh, Cu, etc. The first ferromagnetic layer 220 and the second ferromagnetic layer 260 is made of any ferromagnetic material with in-plane magnetic anisotropy (IMA) such as CoFe, CoFeB or bilayer of CoFe/CoFeB or CoFeB/Fe. The anti-ferromagnetic layer 280 can be made with material such as PtMn, IrMn, NiMn, etc. The registration layer 150 can be optionally used to store memory according to the injected electric current from a write line (not shown) which electrically connected to the registration layer 150. The barrier layer 120 is made with electric insulating material, such as AlOx, MgxOy, etc. The thickness of the barrier layer 120 is around 10 A so as to have electrons tunneling through the barrier layer 120 if a bias voltage is applied between the registration layer 150 and the sensing block 200.

The process to manufacture the racetrack magnetic memory device 20 adopts similar steps as utilized for the magnetic device 10. The differences may be a different mask or few more steps that are required in order to form the racetrack memory. For example, an etching step may be provided to carve out a portion of each blanket film for the registration layer 150 and the barrier layer 120 to form a racetrack.

Figure 9:
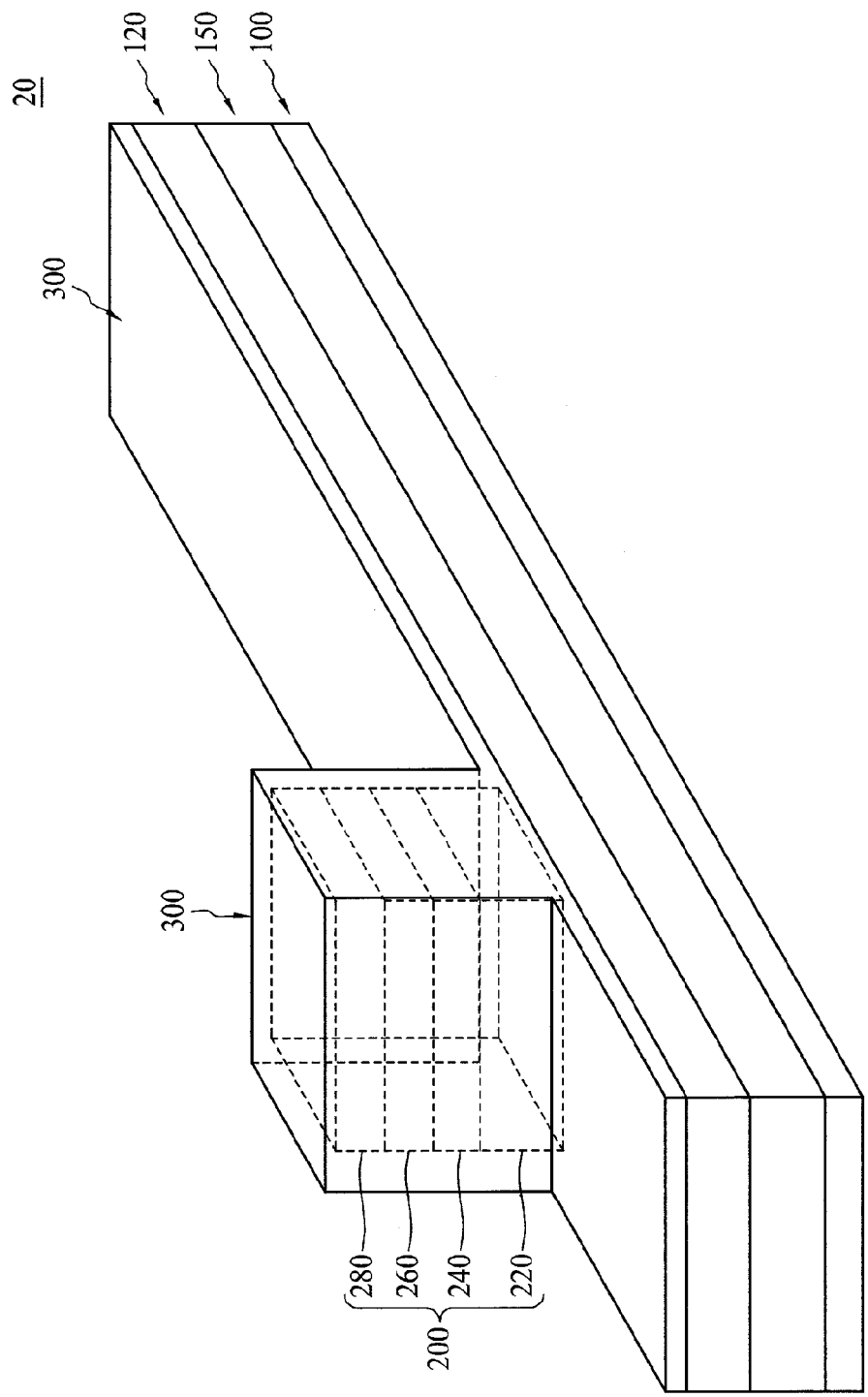
FIG. 9 illustrates racetrack magnetic memory devices having a repair layer.

FIG. 9 shows the deposition of a repair layer 300 on the barrier layer 120 as illustrated in FIG. 8. The material which is selected to form the repair layer 300 may possess a standard oxidation potential value, $E_r$, which is greater than the standard oxidation potential value of the registration layer 150, $E_b$. In an exemplary embodiment, the oxidation potential value, $E_r$, of the repair layer is greater than 0.44V.

In another example, the material for the repair layer 300 can be metal and is preferably selected from Mg, Al, Ti, Mn, Zn, Cr, Ta, or the combination thereof, resulting in the oxygen concentration in the barrier layer 120 to be lowered after coming in contact with the repair layer 300.

In another embodiment, the alloy of Mg, Al, Ti, Mn, Zn, Cr, or Ta is used to form the repair layer 300. Moreover, metal oxide is also an option to form the repair layer 300. In one embodiment, all possible oxidation states of the following metals: Mg, Al, Ti, Mn, Zn, Cr, Ta, or the combination thereof can be chosen to achieve the same objective of the present disclosure.

The methods and features of this invention have been sufficiently described in the above examples and descriptions. It should be understood that any modifications or changes without departing from the spirit of the invention are intended to be covered in the protection scope of the invention.

What is claimed is:

1. A magnetic device, comprising:
   a substrate, comprising:
   a bottom electrode;
   a registration layer configured to store data; and
   a barrier layer disposed on the registration layer;
   a sensing block which is patterned to be distributed on the barrier layer of the substrate; and
   a repair layer disposed conformal to the substrate and the sensing block;
   wherein the barrier layer of the substrate is configured to have a tunneling effect when a bias voltage exists between the sensing block and the registration layer, and the oxygen concentration in the barrier layer is lowered after coming in contact with the repair layer,
   wherein the repair layer comprises metal oxide,
   wherein the sensing block comprises a first ferromagnetic layer made with IMA (In-plane Magnetic Anisotropy) on to the barrier layer, a non-magnetic layer disposed on the first ferromagnetic layer, a second ferromagnetic layer made with IMA on the non-magnetic layer, and an anti-ferromagnetic layer made with IMA on the second ferromagnetic layer.

2. The magnetic device of claim 1, wherein the repair layer is a multiple-layered structure.

3. The magnetic device of claim 1, wherein the registration layer possesses a standard oxidation potential value, $E_b$, and the repair layer possesses a standard oxidation potential value, $E_r$, wherein $E_r$ is greater than $E_b$.

4. The magnetic device of claim 3, wherein $E_r$ is greater than 0.44 volt.

5. The magnetic device of claim 1, wherein the repair layer comprises metal or metal alloy.

6. The magnetic device of claim 5, wherein the repair layer comprises Mg, Al, Ti, Mn, Zn, Cr, Ta, or the combination thereof.

7. The magnetic device of claim 1, wherein the metal oxide comprises all possible oxidation states of the following metals: Mg, Al, Ti, Mn, Zn, Cr, Ta, or the combination thereof.

8. A racetrack magnetic memory device, comprising:
   a substrate, wherein the substrate comprises a bottom electrode, a registration layer and a barrier layer disposed on the registration layer;
   a sensing block which is patterned to distribute on the barrier layer; and
   a repair layer disposed at least on the barrier layer and the registration layer which is configured to store data,
   wherein the barrier layer is configured to have a tunneling effect when a bias voltage exists between the sensing block and the registration layer, and the oxygen concentration in the barrier layer is lowered after coming in contact with the repair layer,
   wherein the repair layer comprises metal oxide,
   wherein the sensing block comprises a first ferromagnetic layer made with IMA (In-plane Magnetic Anisotropy) on the barrier layer, a non-magnetic layer disposed on the first ferromagnetic layer, a second ferromagnetic layer made with IMA on the non-magnetic layer, and an anti-ferromagnetic layer made with IMA on the second ferromagnetic layer.

9. The racetrack magnetic memory device of claim 8, wherein the repair layer is a multiple-layered structure.

10. The racetrack magnetic memory device of claim 8, wherein the registration layer possesses a standard oxidation potential value, $E_b$, and the repair layer possesses a standard oxidation potential value, $E_r$, wherein $E_r$ is greater than $E_b$.

11. The racetrack magnetic memory device of claim 10, wherein $E_r$ is greater than 0.44 volt.

12. The racetrack magnetic memory device of claim 8, wherein the repair layer comprises metal or metal alloy.

13. The racetrack magnetic memory device of claim 12, wherein the repair layer comprises Mg, Al, Ti, Mn, Zn, Cr, Ta, or the combination thereof.

14. The racetrack magnetic memory device of claim 8, wherein the metal oxide comprises all possible oxidation states of the following metals: Mg, Al, Ti, Mn, Zn, Cr, and/or Ta, or the combination thereof.

* * * * *